United States Patent
Liang et al.

(10) Patent No.: US 7,319,595 B2
(45) Date of Patent: Jan. 15, 2008

(54) FOOLPROOF MECHANISM FOR SERVER

(75) Inventors: Yuan-Chen Liang, Tao Yuan Shien (TW); Fu-Ching Ja, Taoyuan Hsien (TW); Ming-Shian Shie, Chang Hua Hsien (TW); Yung-Lung Liu, Pan Chaio (TW)

(73) Assignee: Quanta Computer Inc., Taoyuan Shien (TW)

( * ) Notice: Subject to any disclaimer, the term of this patent is extended or adjusted under 35 U.S.C. 154(b) by 340 days.

(21) Appl. No.: 11/084,183

(22) Filed: Mar. 21, 2005

(65) Prior Publication Data

US 2005/0208809 A1    Sep. 22, 2005

(30) Foreign Application Priority Data

Mar. 22, 2004    (TW) .............................. 93204334 U

(51) Int. Cl.
*H05K 7/16* (2006.01)
(52) U.S. Cl. ...................................... 361/725; 361/727
(58) Field of Classification Search ................ 361/725, 361/727, 788, 756, 801, 802
See application file for complete search history.

(56) References Cited

U.S. PATENT DOCUMENTS

| | | | |
|---|---|---|---|
| 6,671,184 B1 * | 12/2003 | Barringer et al. ........... 361/801 |
| 6,927,975 B2 * | 8/2005 | Crippen et al. ............. 361/687 |
| 7,133,296 B2 * | 11/2006 | Choi et al. .................. 361/798 |
| 2003/0030993 A1 * | 2/2003 | Kitchen et al. ............. 361/726 |
| 2006/0039123 A1 * | 2/2006 | Malagrino et al. .......... 361/727 |

* cited by examiner

Primary Examiner—Dean A. Reichard
Assistant Examiner—Yuriy Semenenko
(74) Attorney, Agent, or Firm—Rabin & Berdo, PC

(57) ABSTRACT

A foolproof mechanism for a server is disclosed for use in a blade server and/or in a similar electronic apparatus having a chassis to which with an insertion portion of a blade board is inserted and coupled horizontally and is constrained vertically. The foolproof mechanism includes a blade housing mounted on an outer side of the insertion portion, a depression structure formed on the blade housing, and an anti-moving button installed loosely in the depression structure. By gravity, the anti-moving button is automatically sunk in the depression structure while the insertion portion is inserted in a correct orientation, thereby smoothly inserting the insertion portion into the chassis; on the contrary, the anti-moving button is automatically projected out of the depression structure while the insertion portion is inserted incorrectly, thereby blocking the insertion portion from inserting into the chassis, thus preventing the insertion portion and the chassis from being damaged.

11 Claims, 4 Drawing Sheets

FOOLPROOF MECHANISM FOR SERVER

RELATED APPLICATIONS

The present application is based on, and claims priority from, Taiwan Application Serial Number 93204334, filed on Mar. 22, 2004, the disclosure of which is hereby incorporated by reference herein in its entirety.

FIELD OF THE INVENTION

The present invention relates to a foolproof mechanism for a server, which is used in a blade server as well as in a similar electronic apparatus having a chassis in which an insertion portion of a blade board is allowed to be inserted horizontally and is constrained vertically, thereby preventing the insertion portion from being inserted into the chassis with an incorrect orientation.

BACKGROUND OF THE INVENTION

Using the application of blade server as an example for explanation, many companies currently deploy tens or hundreds of low-cost small servers to tackle with the network demands, and thus develop a blade server for further promoting economical efficacy. The so-called "blade server" stands for an apparatus integrating processors, memories, and even hard disk drivers into one single mother board, i.e. the so-called "blade" or "blade board". In one single blade server chassis, tens or even more blade boards can be accommodated, wherein one blade board is actually one set of server. With sharing the resources such as a server chassis, a power supply, a monitor and a keyboard, etc., those blade boards can be effectively integrated into an environment of large data center.

Reliability and expandability are the most attractive features of the blade server. If one blade board is broke, other blade boards still can work normally, and another blade board can be chosen and used as a substitute without service interruption since the server chassis supports the hot pulling-out and hot plugging of the blade boards/elements. Therefore, users merely need to add more blade boards and allocate those resources to the most demanding area, in case the processing capability is required to be promoted.

The blade sever generally provides the functions of hot pulling-out and hot plugging, so that it can be expected that it will have more actions of hot pulling-out and hot plugging than a conventional server. The action of pulling-out is relatively simple, and merely needs to exerting force to pull out a blade board. However, while a blade board is inserted into a server chassis, the insertion orientation thereof has to be particularly noted. Although the blade board still can be inserted into the server chassis even with an incorrect insertion orientation, yet the insertion portion of the blade board cannot be electrically conducted with the server chassis, so that the blade board has to be pulled out and inserted again with the correction insertion orientation, thus resulting in poor operability. Further, with improper force, it is very likely to cause damages to the blade board or/and the server chassis.

SUMMARY OF THE INVENTION

To resolve the aforementioned problems, the preset invention is provided after taking the respective related items into consideration, and the object of the present invention is to provide a simple and economical foolproof mechanism, so that operators do not need to pay attention on whether the orientation of insertion portion of the blade board is correct so as to prevent the blade board from being inserted in incorrectly. In other words, with the foolproof mechanism, the blade board can only be inserted into the server chassis in a correct orientation, thus enabling the blade board and the server chassis to be electrically conducted, and if the blade board is inserted in with an incorrect orientation, the blade board will be automatically blocked and cannot get inside the server chassis.

In order to achieve the aforementioned object, the foolproof mechanism of the present invention comprises: a blade housing mounted on an insertion portion of such as a blade board; a depression structure formed on the blade housing, wherein the depression structure has an opening formed on the top surface of the blade housing; and an anti-moving button installed loosely in the depression structure, wherein the anti-moving button can sink into the depression structure or protrude out of the blade housing. By gravity, while the insertion portion of the blade board is inserted into the server chassis horizontally with a correct vertical orientation, the anti-moving button will slide down to the depression structure in a vertical direction and automatically sink into the opening of the blade housing, and thus the insertion portion can be smoothly inserted into a socket inside a chassis (such as a server chassis). On the other hand, while the insertion portion of the blade board is inserted into the server chassis with an incorrect vertical orientation, the anti-moving button will slide out of the depression structure in a vertical direction due its weight and automatically protrude out of the opening of the blade housing, and thus the insertion portion can be blocked from being smoothly inserted into the socket inside the server chassis, thereby preventing the blade board or/and the server chassis from the damage caused by the incorrect vertical orientation while the blade board is being inserted into the server chassis.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the following, the present invention is explained in detail with reference to the preferred embodiments as shown in figures.

Figure 1:
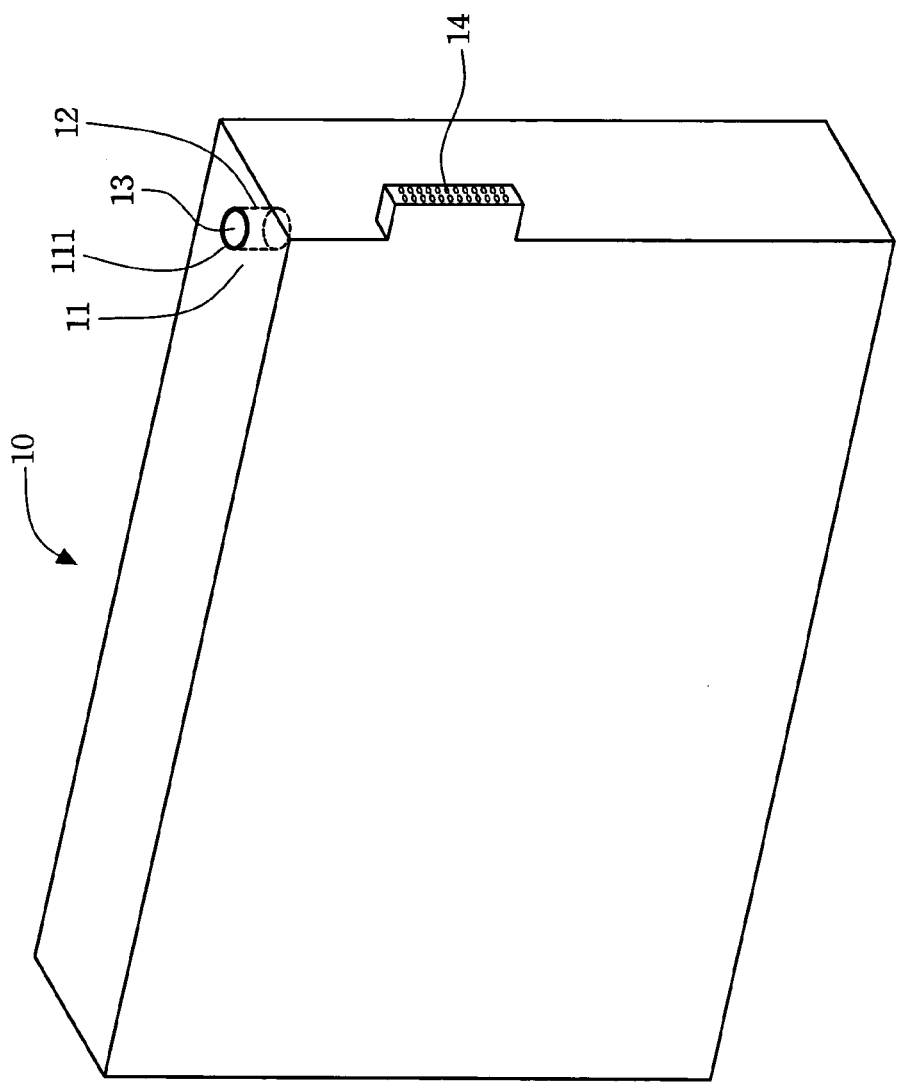
FIG. 1 is a schematic view showing a foolproof mechanism installed on a blade board enclosed in a blade housing, according to a preferred embodiment of the present invention.

Referring to FIG. 1, the foolproof mechanism of the present invention comprises a blade housing 11, a depression structure 12 and an anti-moving button 13.

The blade housing 11 is mounted on the outer surface of an insertion portion of an object such as a blade board 10.

The depression structure 12 is formed vertically on a surface of the blade housing 11, and the surface is generally used to determine if the blade housing 11 (i.e. the blade server 10) is inserted into a server chassis 20 with a correct orientation. For example, as shown in FIG. 1, the depression structure 12 is formed on the top surface of the blade housing 11. The blade depression structure 12 has an opening 111 formed on the top surface of the blade housing 11.

The depression structure 12 can be formed directly on the blade housing 11, or preformed first and then installed on the blade housing.

The anti-moving button 13 is installed contained inside the depression structure 12. The anti-moving button 13 can slide vertically along the inner sidewall of the depression structure 12, i.e. the anti-moving button 13 can be positioned inside or outside the blade housing 11, and can retract into the depression structure 12 or protrude out of the depression structure by its own weight (gravity). Further, the depression structure 12 is a structure that can prevent the anti-moving button 13 contained therein from escaping from the depression structure 12.

Figure 2:
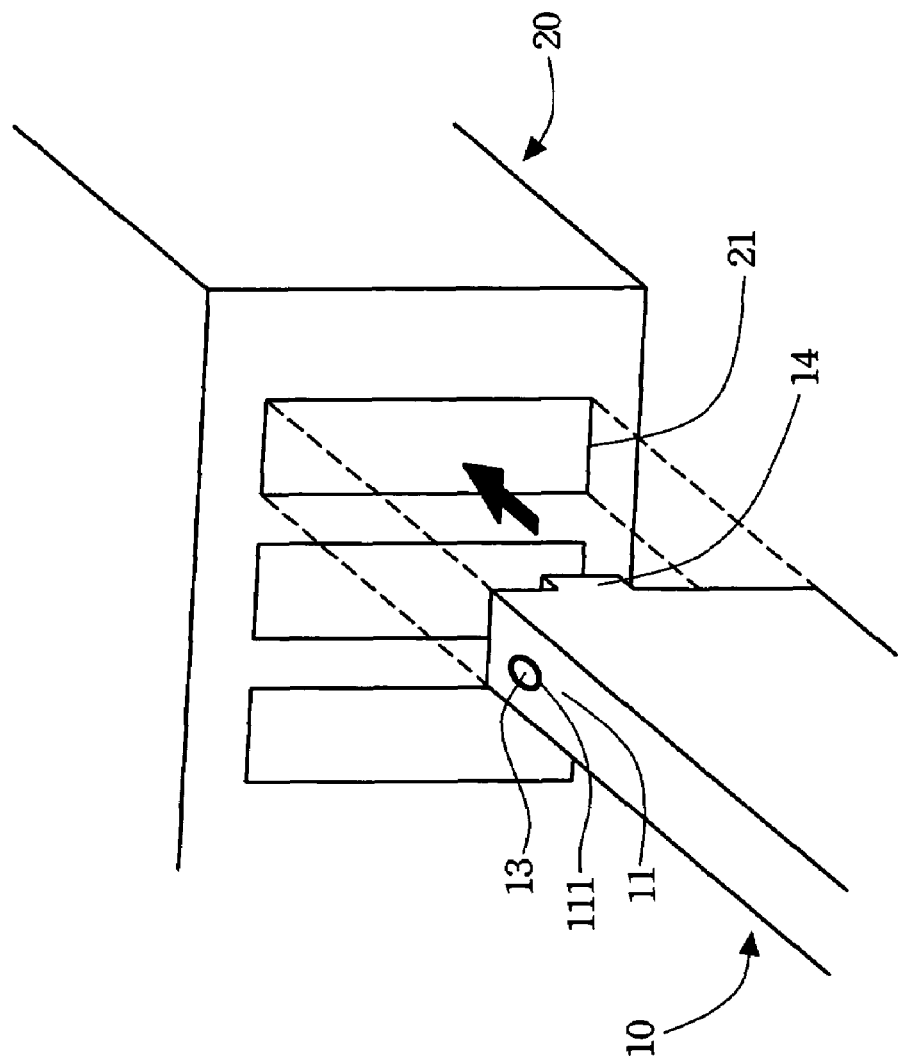
FIG. 2 a schematic view showing the blade board as shown in FIG. 1 is inserted horizontally into a server chassis with a correct vertical orientation according to the preferred embodiment of the present invention, wherein an anti-moving button sinks into the blade housing.

Such as shown in FIG. 2, when the blade board 10 is desired to be inserted into the server chassis 20, one side (an insertion portion) of the blade board 10 having a plug 14 is inserted into a socket 21 of the server chassis 20. If the vertical orientation of the blade board 10 is correct (i.e. the anti-moving button 13 is positioned on the top side of the blade housing 11), the anti-moving button 13 will slide downwards along the inner sidewall of the depression structure 12 and automatically sink into the opening 111 of the blade housing 11 due to its own weight. Therefore, the blade board 10 can be smoothly inserted into the socket of the server chassis 20 without any interference. Accordingly, the server chassis 20 is electrically conducted with the plug 14 of the blade board 10, and the blade board 10 can be activated in operation.

Figure 3:
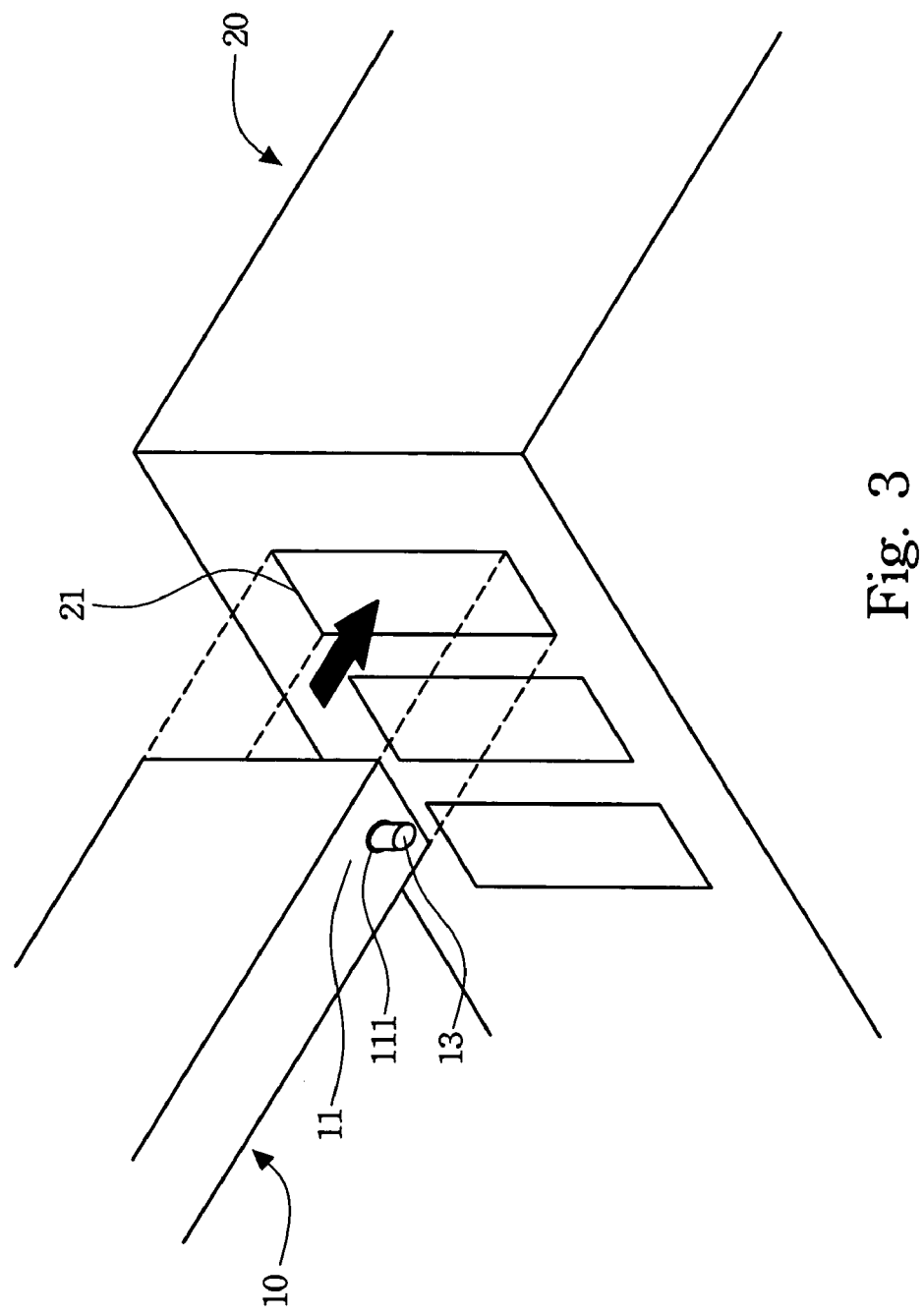
FIG. 3 a schematic view showing the blade board as shown in FIG. 1 is inserted horizontally into a server chassis with an incorrect vertical orientation according to the preferred embodiment of the present invention, wherein an anti-moving button protrudes out of the blade housing.

Such as shown in FIG. 3, when the blade board 10 is desired to be inserted into the server chassis 20, one side (an insertion portion) of the blade board 10 having the plug 14 is inserted into a socket 21 of the server chassis 20. If the vertical orientation of the blade board 10 is incorrect (i.e. the anti-moving button 13 is positioned on the bottom side of the blade housing 11), the anti-moving button 13 will slide downwards along the inner sidewall of the depression structure 12 and automatically protrude out of the opening 111 of the blade housing 11 due to its own weight and thus become an obstruction for blocking the blade board 10 having an incorrect vertical orientation from continuously moving towards the socket 21, thus preventing the blade board 10 or/and the blade board 10 from being damaged.

Figure 4:
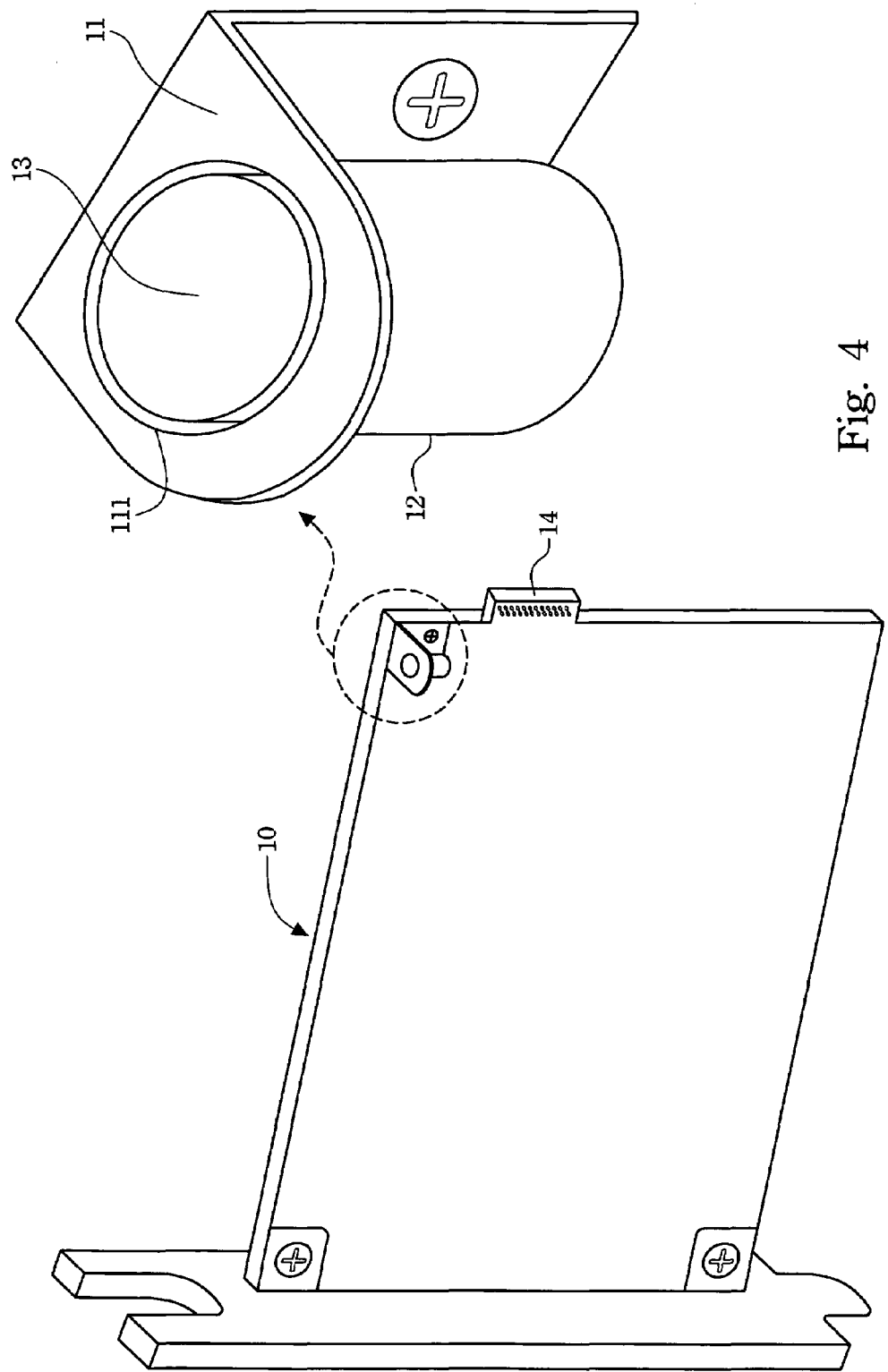
FIG. 4 is a schematic view showing a foolproof mechanism installed on a blade board having no blade housing, according to the other preferred embodiment of the present invention.

Within the technical scope of the present invention, various embodiments can be practically applied. For example, besides the blade server, the present invention also can be applied in any similar electronic apparatus having a chassis in which an insertion portion of a blade board is allowed to be inserted horizontally and is constrained vertically (in the vertical orientations of 90 degrees and 270 degrees). Although, for explanation, the figures show the depression structure 12 having a circular cross-section; the blade housing 11 having a circular opening 111; and the anti-moving button 13 in one single cylindrical shape, yet the blade housing 11, the opening 111, the depression structure 12 and the anti-moving button 13 of the present invention are not limited thereto with respect to the shapes and numbers thereof. Such as shown in FIG. 4, the foolproof mechanism of the present invention is installed on the motherboard of a blade board having no blade housing, and also has the same function as the aforementioned embodiment. Therefore, as long as the function of the foolproof mechanism can be properly performed, the blade housing 11; the opening 111; the depression structure 12; and the anti-moving button 13 of various shapes and numbers all are suitable for use in the present invention.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A foolproof mechanism for a server, suitable for use in a blade server as well as in a similar electronic apparatus having a chassis in which an insertion portion of a blade board is allowed to be inserted horizontally and is constrained vertically, said foolproof mechanism comprising:
   a blade housing mounted on said insertion portion;
   a depression structure formed vertically from a first surface of said blade housing, wherein said depression structure has an opening formed in said first surface of said blade housing; and
   an anti-moving button installed loosely in said depression structure, wherein said anti-moving button sinks into said depression structure due to gravity when said first surface faces upwards; and said anti-moving button protrudes out of said blade housing through said opening due to gravity when said first surface faces downwards.

2. The foolproof mechanism of claim 1, wherein said depression structure is formed directly on said blade housing.

3. The foolproof mechanism of claim 1, wherein said depression structure is preformed first, and then is installed on said blade housing.

4. The foolproof mechanism of claim 1, wherein said anti-moving button is allowed to move vertically downward along the inner sidewall of said depression structure.

5. The foolproof mechanism of claim 1, wherein said depression structure prevents said anti-moving button contained therein from moving out.

6. The foolproof mechanism of claim 1, wherein said opening is formed in an arbitrary shape.

7. The foolproof mechanism of claim 1, wherein said depression structure is formed in an arbitrary shape.

8. The foolproof mechanism of claim 1, wherein said anti-moving button is formed in an arbitrary shape.

9. The foolproof mechanism of claim 1, wherein a sidewall surface of said blade board is larger than said first surface of said blade board.

10. The foolproof mechanism of claim 1, wherein said horizontal direction that said blade board is inserted along is parallel to a bottom surface of said chassis.

11. The foolproof mechanism of claim 1, wherein said insertion portion of said blade board is allowed to be inserted into said chassis at an angle vertical to said chassis and along a horizontal direction.

* * * * *